United States Patent [19]

Mink

[11] Patent Number: 4,870,650
[45] Date of Patent: Sep. 26, 1989

[54] SEMICONDUCTOR LASER HAVING A BOUNDARY-REGION ABSORPTION LAYER

[75] Inventor: Jan Mink, Eindhoven, Netherlands

[73] Assignee: U.S. Philips Corp., New York, N.Y.

[21] Appl. No.: 304,894

[22] Filed: Jan. 30, 1989

Related U.S. Application Data

[63] Continuation of Ser. No. 123,696, Nov. 23, 1987, abandoned.

[30] Foreign Application Priority Data

Nov. 27, 1986 [NL] Netherlands ............................ 8603009

[51] Int. Cl.⁴ .......................... H01S 3/19; H01L 33/00
[52] U.S. Cl. ......................................... 372/46; 372/45; 357/17
[58] Field of Search ........................ 372/46, 45, 43, 44; 357/16, 17

[56] References Cited

U.S. PATENT DOCUMENTS 4,597,085 5/1986 Mito et al. .............................. 372/46
4,692,206 9/1987 Kaneiwa et al. ....................... 372/45

FOREIGN PATENT DOCUMENTS 0034088 2/1985 Japan ..................................... 372/46
0164287 7/1986 Japan ..................................... 372/43

Primary Examiner—William L. Sikes
Assistant Examiner—Georgia Y. Epps
Attorney, Agent, or Firm—Steven R. Biren

[57] ABSTRACT

A semiconductor laser having a buried hetero junction, more particularly a DCPBH laser, in which the active layer (3) is located in a "mesa", which is laterally bounded by a boundary region comprising at least one blocking layer (6) having a larger band gap than the active layer. The boundary region includes an absorption layer (13) having a smaller band gap than the active layer, this absorption layer being located at such a small lateral distance from the active layer that it lies within the amplification profile of the first-order lateral oscillation mode. As a result, the first and higher oscillation modes as well as the thyristor effect are suppressed.

7 Claims, 2 Drawing Sheets

SEMICONDUCTOR LASER HAVING A BOUNDARY-REGION ABSORPTION LAYER

This is a continuation of application Ser. No. 123,696 filed Nov. 23, 1987, now abandoned.

BACKGROUND OF THE INVENTION

The invention relates to a semiconductor laser having a substrate region of a first conductivity type provided with a connection conductor, a first passive layer disposed thereon of the first conductivity type, a strip-shaped region located within a resonant cavity and comprising at least one active layer disposed on the first passive layer, a second passive layer disposed thereon of the second opposite conductivity type, a pn junction by which at a sufficient current strength in the forward direction coherent electromagnetic radiation can be produced, and a boundary region which is provided on either side of, but not on the strip-shaped region and comprising at least one blocking layer of the second conductivity type, which laterally bounds the strip-shaped region, the passive layers and the blocking layer having a larger band gap and a smaller refractive index for the radiation produced than the active layer and an upper layer of the second conductivity type electrically connected to a connection conductor being provided on the second passive layer and the boundary region.

A semiconductor laser of the kind described is known from European Patent Application published under No. 83697 A1.

Semiconductor lasers having a strip-shaped active region generally have the property that the electromagnetic waves amplified in the active region can oscillate in different oscillation modes. As far as wave components are concerned which propagate in the longitudinal direction of the region, these modes are designated as longitudinal modes, while for wave components having a direction of propagation in the direction of thickness these modes are designated as transversal modes and for wave components propagating in the direction of width of the active region these modes are designated as lateral modes.

For many applications, more particularly for telecommunication purposes, it is desirable that the number of possible modes of oscillation is limited as far as possible so that preferably the laser amplification is sufficient to maintain the oscillation for only one mode of oscillation.

For the transversal modes, this can be achieved by an efficient choice of the variation of the refractive index in the direction of thickness, and of the thickness of the active region. For the longitudinal modes, the object aimed at can be achieved by a suitable choice of the reflection elements defining the resonant cavity.

For the lateral modes, attempts have been made to achieve this by a suitable choice of the variation of the refractive index in the direction of width of the active region, while moreover both an optical and an electrical confinement of the active laser region is obtained. This is achieved in a structure comprising a "buried" active layer, such as that described in the aforementioned Application EP 83697.

SUMMARY OF THE INVENTION

The present invention has inter alia for its object to suppress in an even more effective manner the lateral oscillation modes of higher order.

The invention is based inter alia on the recognition of the fact that this can be achieved by providing an absorption layer at suitably chosen areas.

According to the invention a semiconductor laser of the kind described above is characterized in that the boundary region comprises an absorption layer disposed on the first blocking layer and having a smaller band gap than the active layer, this absorption layer being located at such a small lateral distance from the active layer that it lies within the amplification profile of the first-order lateral oscillation mode.

According to a preferred embodiment, the boundary region further comprises a second blocking layer of the first conductivity type, the absorption layer being disposed between the first and second blocking layers.

Due to the presence of the absorption layer according to the invention, the losses for the first-order lateral oscillation mode increase. The optical confinement for the oscillation modes of higher order is in fact considerably less satisfactory than for the zero-order mode so that in comparison with the zero-order mode a larger fraction of the first-order lateral mode reaches the absorption layer. The threshold current density for the first-order and higher order modes thus becomes relatively higher with respect to that for the zero-order oscillation mode, which thus becomes considerably more stable.

Moreover, in the laser structure according to the invention, the thyristor effect of the boundary region is considerably reduced. The pnpn structure constituted by the substrate, the first passivation layer, the second blocking layer and the upper layer can no longer pass to the conductive state under normal operating conditions due to the interposition of the absorption layer. Besides, in certain embodiment, due to the presence of the absorption layer parasitic lateral leakage currents are avoided, as a result of which the threshold current density decreases and operation at room temperature becomes possible.

It is further of great importance that the absorption layer is included in the current-limiting structure, i.e. not in contact with the active layer. Thus, no interaction occurs between the absorption layer and the active layer and the parameters of the absorption layer can be chosen independently of those of the active layer. Instabilities due to an interaction between the active layer and the absorption layer can thus be avoided.

It should be noted that, when the boundary region comprises only one blocking layer of the second conductivity type, the absorption layer disposed thereon should be of the first conductivity type and in this case fulfils at the same time the function of current-blocking layer.

In general, a satisfactory suppression of the first-order and higher order lateral oscillation modes can be obtained when the absorption layer is located at the area of the active layer at a distance of at most 0.5 $\mu$m from the active layer.

The invention is of particular importance in laser structures of the so-called DCPBH (Double Channel Planar Buried Hetero) type, in which the strip-shaped region is defined by two grooves which extend from the upper side of the second passive layer through the active layer into the first passive layer and are filled at least in part by the said boundary region. Due to the presence of the absorption layer, it is sometimes possible to remove the active region outside the strip-shaped region, as a result of which the leakage currents flowing via these parts of the active layer are avoided.

BRIEF DESCRIPTION OF THE DRAWING

The invention will now be described more fully with reference to several embodiments and the drawing, in which.

Semiconductor regions of the same conductivity type are cross-hatched in the same direction.

DESCRIPTION OF THE PREFERRED EMBODIMENTS

Figure 1:
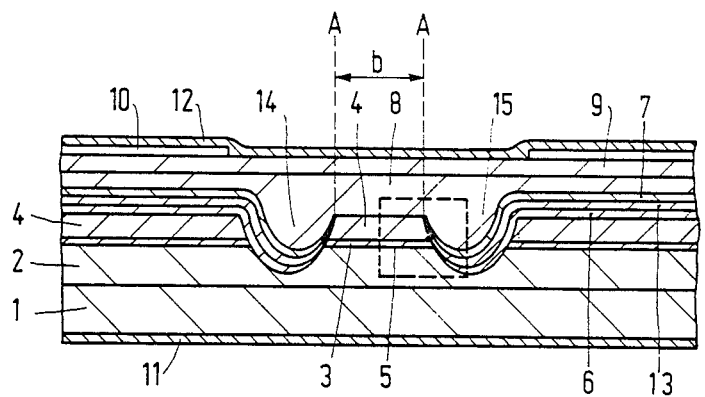
FIG. 1 shows diagrammatically in cross-section a semiconductor laser according to the invention.

FIG. 1 shows diagrammatically in cross-section a semiconductor laser according to the invention. This laser is of the known DCPBH type as described in European Patent Application No. 83697 and has a substrate region 1 of a first (in this case n) conductivity type provided with a connection conductor 11. A first passive layer 2 also of the n conductivity type is provided thereon. There is further present a strip-shaped region AA having a width b (FIG. 1), which comprises an active layer 3 disposed on the first passive layer 2 and a second passive layer 4 disposed thereon of the second opposite conductivity type (so in this case p-type). There is further present in this strip-shaped region a pn junction 5, which in this embodiment is situated between the first passive layer 2 and the active layer 3, which in this embodiment is weakly p-type conducting. The strip-shaped region extends in the form of a "mesa" in a direction at right angles to the plane of the drawing and is bounded at its ends by crystal faces, generally cleavage faces of the crystal, the so-called mirror faces, at right angles thereto. These mirror faces form in the longitudinal direction a Fabry Pérot resonant cavity, within which the strip-shaped region is situated. The said pn junction 5 can product coherent electromagnetic radiation within this resonant cavity at a sufficient current strength in the forward direction.

A boundary region comprising a first blocking layer 6 of the second (p) conductivity type laterally bounding the strip-shaped region AA and a second blocking layer 7 of the first (n) conductivity type is located on either side of, but not on the strip-shaped region. The layers 6 and 7 in this embodiment are provided partly in two grooves 14 and 15, which are formed in the layer structure (2,3,4). The passive layers 2 and 4 and the blocking layers 6 and 7 all have a larger band gap and a smaller refractive index for the radiation produced than the active layer 3. Further, an upper layer 8 of the second (p) conductivity type electrically connected to a connection conductor 12, in this embodiment through a highly doped p-type contact layer 9, is provided on the second passive layer 4 and the boundary region.

Figure 2:
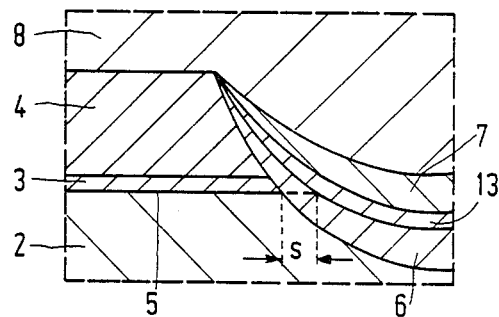
FIG. 2 shows a detail of FIG. 1 on an enlarged scale.

According to the invention, in this embodiment, an absorption layer 13 having a smaller band gap that the active layer 3 is provided on the first blocking layer between the first blocking layer 6 and the second blocking layer 7. This absorption layer 13 is located at such a small lateral distance from the active layer 3 that it lies within the amplification profile of the first-order lateral oscillation mode. In the present embodiment, the distance s (cf. FIG. 2) is chosen for this purpose to lie between 0.2 $\mu$m and 0.5 $\mu$m. In order to show more clearly the relative location of the various layers, in FIG. 2 the part of the cross-section enclosed in FIG. 1 by a broken line is represented on an enlarged scale.

In the embodiment described here, the following layer thickness, compositions and dopings were used:

| Layer | Composition ($In_xGa_{1-x}As_yP_{1-y}$) | | Thickness ($\mu$m) | Type | Doping concentration atoms/cm$^3$ |
|---|---|---|---|---|---|
| | x | y | | | |
| 1 | 1,0 | 0 | 80 | N | $5 \times 10^{18}$ (S) |
| 2 | 1 | 0 | 3 | N | $2 \times 10^{18}$ (Sn) |
| 3 | 0,72 | 0,61 | 0,15 | P$^-$ | — |
| 4 | 1 | 0 | 1 | P | $2 \times 10^{18}$ (Zn) |
| 6 | 1 | 0 | 0,5 | P | $8 \times 10^{17}$ (Zn) |
| 7 | 1 | 0 | 0,5 | N | $8 \times 10^{17}$ (Ge) |
| 8 | 1 | 0 | 1 | P | $8 \times 10^{17}$ (Zn) |
| 9 | 0,79 | 0,49 | 1 | P | $2 \times 10^{18}$ (Zn) |
| 13 | 0,68 | 0,70 | 0,3 | P | $10^{18}$ (Zn) |

For the thickness of the layers 6, 7 and 13 in this case the thickness on the flat part of the structure outside the grooves 14 and outside the "mesa" is chosen.

The laser described here produces coherent radiation having a wavelength of about 1.3 $\mu$m and exhibits, due to the effect of the absorption layer 13, which suppresses the first-order and higher order lateral oscillation modes, a stable oscillation in the zero-order lateral oscillation mode.

The laser can be manufactured in the following manner. The starting material is a substrate 1 of n-type indium phosphide having a (100) orientation, a thickness of about 360 $\mu$m and an n-type doping concentration of, for example, $5.10^{18}$ atoms per cm$^3$ (cf. FIG. 3).

Figure 3:
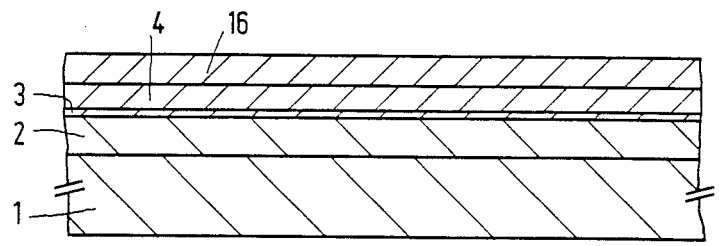
FIGS. 3 to 5 show diagrammatically cross-sections of the semiconductor laser of FIG. 1 at successive stages of manufacture.
Figure 4:
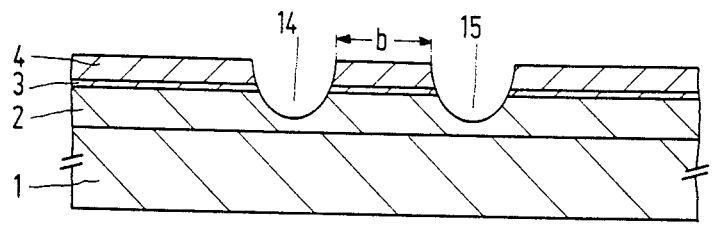

In order of succession a layer 2 of n-type indium phosphide having a thickness of 3 $\mu$m and a doping of $2.10^{18}$ tin atoms per cm$^3$, an undoped, i.e. not intentionally doped, active layer 3 having the composition $In_{0.72}Ga_{0.28}As_{0.61}P_{0.39}$ and a thickness of 0.15 $\mu$m, a layer 4 of p-type indium phosphide having a doping concentration of $2.10^{18}$ zinc atoms per cm$^3$ and a thickness of 1 $\mu$m and a p-type covering layer 16 having the composition $In_{0.79}Ga_{0.21}As_{0.49}P_{0.51}$ and a zinc doping of $5.10^{18}$ atoms per cm$^3$ are grown in known manner, for example by epitaxial growth from the liquid phase (LPE), on this substrate (cf. FIG. 3). Subsequently, the assembly is removed from the growing apparatus, the covering layer 16 serving to prevent that due to the high temperature phosphorus evaporates from the layer 4. After the layer structure has been cooled, the covering layer 16 is removed, for example by etching with a mixture of concentrated sulphuric acid and 30% $H_2O_2$.

Grooves 14 and 15 are then etched into the surface of the layer 4 by means of usual photolithographic techniques with the aid of, for example, the etchant bromomethanol. These grooves have on the upper side a width of about 9 $\mu$m and have a depth of 3 $\mu$m. The "mesa" has a width b of about 1.5 $\mu$m.

The assembly is now placed again in the growing apparatus. First a p-type indium phosphide layer is grown having a doping of $8.10^{17}$ zinc atoms per cm$^3$, i.e. the first blocking layer. Subsequently, the absorption layer 13 is grown thereon having the composition $In_{0.6-}$ 8Ga$_{0.32}$As$_{0.70}$P$_{0.30}$ and a p-type doping concentration of 10$^{18}$ zinc atoms per cm$^3$. The second blocking layer 7 of n-type indium phosphide having a doping concentration of 8.10$^{17}$ germanium atoms per cm$^3$ is grown thereon. These layers 6, 13 and 7 have on the flat part of the structure outside the grooves 14, 15 and the "mesa", thicknesses of 0.5 μm, 0.3 μm and 0.5 μm, respectively. They partly fill the grooves, but do not grow on the "mesa".

Figure 5:
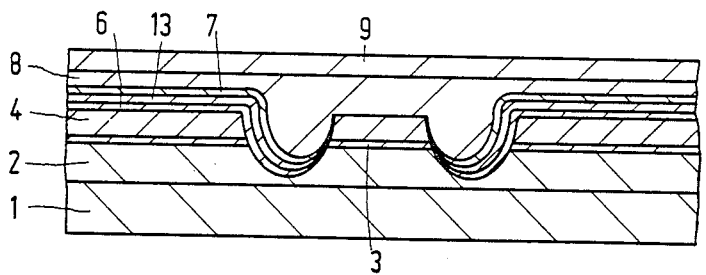

Subsequently (cf. FIG. 5), a p-type indium phospide layer 8 is grown until a substantially flat surface is obtained. This layer 8, which has outside the grooves and the "mesa" a thickness of about 1 μm, also has a doping of 8.10$^{17}$ zinc atoms per cm$^3$. Finally, a 1 μm thick contact layer 9 having the composition In$_{0.79}$Ga$_{0.21}$As$_{0.49}$P$_{0.51}$ and a doping of 10$^{18}$ zinc atoms per cm$^3$ is provided and the substrate is etched down to a thickness of about 80 μm, after which the structure of FIG. 5 is obtained. After an oxide layer 10, which is removed above the active part of the layer, and the electrode layers 11 and 12 have been provided, the ultimate layer structure of the laser is obtained. This structure can then be subdivided into separate lasers by scratching and breaking, while at the same time the cleavage faces serving as mirror faces are obtained.

The laser manufactured in the manner described above can then be finished and arranged in a suitable encapsulation.

Figure 6:
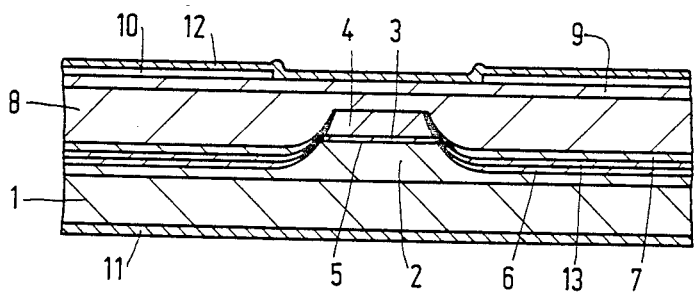
FIG. 6 shows diagrammatically in cross-section another embodiment of a semiconductor laser according to the invention. The figures are purely schematic and are not drawn to scale. Corresponding parts are generally denoted by the same reference numerals.

Although in the above embodiment a semiconductor laser of the DCPBH type is described, the invention is not limited thereto. For example, the strip-shaped active region AA need not be bounded by grooves, but it may also be realized in the form of a mesa-shaped projection. The cross-section of the laser becomes, for example, as shown in FIG. 6. This is not essential to the effect of the invention. In this case, the active layer 3 is located only in the "mesa" and lateral leakage currents via the active layer outside the "mesa" are therefore excluded.

Further, other materials may be used when other laser wavelengths are desired. For example, the substrate region may consist of gallium arsenide and the passive layers as well as the absorption layer may consist of gallium aluminum arsenide. Thus, lasers having wavelengths in the red or infrared range are obtained.

The active layer 3, which is not intentionally doped, may also be weakly n-conducting instead of weakly p-conducting. In this case, the pn junction 5 is situated not between the layers 3 and 2, but between the layers 3 and 4. If desired, the active layer 3 may also be doped, however.

The invention is not limited to the embodiments described. For example, instead of or in conjunction with the current-limiting oxide layer 10 partly etched away also other current-limiting means may be used. Known means consist, for example, in carrying out a proton bombardment outside the active region and/or in providing a current-limiting buried layer, which is interrupted at the area of the active region. Further, the resonant cavity may be constituted instead of by mirror faces at right angles to the strip-shaped active region by periodical variations in the effective refractive index, as in the known DFB and DBR lasers. In the embodiments described, the conductivity types may also be replaced (all simultaneously) by the opposite conductivity types.

What is claimed is:

1. A semiconductor laser comprising a substrate region of a first conductivity type provided with a connection conductor, a first passive layer of the first conductivity type disposed on said substrate, a resonant cavity, a strip-shaped region located within said resonant cavity and comprising at least one active layer disposed on the first passive layer, a second passive layer of the second opposite conductivity type on said active layer, a pn junction formed by said active layer and said first passive layer by which coherent electromagnetic radiation can be produced by a forward current during operation, and a boundary region provided on both sides of, but not on, the strip-shaped region and comprising at least one laterally-extending first blocking layer of the second conductivity type, which laterally bounds the strip-shaped region, the passive layers and said at least one blocking layer having a larger band gap and a smaller refractive index for the radiation produced than the active layer, and an upper layer of the second conductivity type electrically connected to a connection conductor provided on the second passive layer and the boundary region, characterized in that the boundary region further comprises an absorption layer of said second conductivity type on said at least one first blocking layer and having a smaller band gap than that of the active layer, said absorption layer being located at such a small lateral distance from the active layer that it lies within the amplification profile of the first-order lateral oscillation mode.

2. A semiconductor laser as claimed in claim 1, characterized in that the absorption layer is located at the area of the active layer at a distance of at most 0.5 μm from the active layer.

3. A semiconductor laser as claimed in claim 1 or 2, characterized in that the boundary region also comprises a second blocking layer of the first conductivity type, the absorption layer being located between the first and second blocking layers.

4. A semiconductor laser as claimed in claim 1 or 2, characterized in that the at least one first blocking layer is of the first conductivity type and in that the absorption layer is of the first conductivity type.

5. A semiconductor laser as claimed in claim 1 or 2, characterized in that the substrate region and the passive layers comprise indium phosphide and the absorption layer comprises indium gallium arsenic phosphide.

6. A semiconductor laser as claimed in claim 1 or 2, characterized in that the substrate region comprises gallium arsenide and the passive layers and the absorption layer comprise gallium aluminum arsenide.

7. A semiconductor laser as claimed in claim 1 or 2, characterized in that the strip-shaped region is bounded by two grooves, which extend from the upper side of the second passive layer through the active layer into the first passive layer and are filled at least in part by said boundary region.

* * * * *